United States Patent
Ross

(10) Patent No.: US 6,204,201 B1
(45) Date of Patent: Mar. 20, 2001

(54) METHOD OF PROCESSING FILMS PRIOR TO CHEMICAL VAPOR DEPOSITION USING ELECTRON BEAM PROCESSING

(75) Inventor: Matthew Ross, San Diego, CA (US)

(73) Assignee: Electron Vision Corporation, San Diego, CA (US)

( * ) Notice: Subject to any disclaimer, the term of this patent is extended or adjusted under 35 U.S.C. 154(b) by 0 days.

(21) Appl. No.: 09/330,709

(22) Filed: Jun. 11, 1999

(51) Int. Cl.[7] .......................... H01L 21/31; H01L 21/461
(52) U.S. Cl. .................................................. 438/778
(58) Field of Search ............................... 428/210; 430/18; 438/4, 434, 758, 759, 778

(56) References Cited

U.S. PATENT DOCUMENTS

| | | | |
|---|---|---|---|
| 4,222,792 | 9/1980 | Lever et al. | 148/1.5 |
| 4,944,836 | 7/1990 | Beyer et al. | 156/645 |
| 5,468,595 | 11/1995 | Livesay | 430/296 |
| 5,801,094 | 9/1998 | Yew et al. | 438/624 |

*Primary Examiner*—Cathy Lam
(74) *Attorney, Agent, or Firm*—Roberts & Mercanti LLP

(57) ABSTRACT

A process for the treatment of the surface of dielectric films to remove moisture and other contaminants. Such treatment is done by electron beam exposure in order to prepare the surface for a subsequent chemical vapor deposition of oxide, nitride or oxynitride layers. The films are useful in the manufacture of integrated circuits.

23 Claims, No Drawings

METHOD OF PROCESSING FILMS PRIOR TO CHEMICAL VAPOR DEPOSITION USING ELECTRON BEAM PROCESSING

BACKGROUND OF THE INVENTION

1. Field of the Invention

The present invention relates to cured dielectric films and to a process for the treatment of the surface of such films to remove moisture and other contaminants therefrom. Such treatment is done by electron beam exposure of the dielectric surface in order to prepare it for a subsequent chemical vapor deposition of oxide, nitride or oxynitride layers. These films are useful in the manufacture of integrated circuits.

2. Description of the Related Art

The field of semiconductor technology continually requires the formation of integrated circuit chips having more and faster circuits thereon. Such ultralarge scale integration has resulted in a continued shrinkage of feature sizes with the result that a large number of devices are available on a single chip. With a limited chip surface area, the interconnect density typically expands above the chip substrate in a multi-level arrangement and therefore the devices have to be interconnected across these multiple levels.

The interconnects must be electrically insulated from each other except where designed to make electrical contact. Usually electrical insulation requires depositing dielectric films onto a surface. It is known in the art that a variety of resins are useful in the semiconductor fields to provide a dielectric coating to silicon wafers and other microelectronic devices. Such coatings protect the surface of substrates and form dielectric layers between electric conductors on integrated circuits. Semiconductor devices have multiple arrays of patterned interconnect levels that serve to electrically couple individual circuit elements thus forming the integrated circuit.

In the processing of microelectronic devices, dielectric layers are typically subjected to planarizing and etching treatments and hence adjacent layers are usually separated by an etch stop or other separation layer. Etch stop layers usually comprises an oxide, nitride or oxynitride film such as a silicon oxide film formed using chemical vapor deposition (CVD) or plasma enhanced CVD (PECVD) techniques. However, the application of such films to dielectric layers has become a problem. This is due to moisture and contaminants such as organic solvents, hydrocarbons and stray particles on the dielectric surface.

It has now been found that such moisture and contaminants can be eliminated from the surface of dielectric films by exposing the surface of the dielectric to electron beam radiation. Such electron beam exposure effectively removes these contaminants and allows the surface to more readily accept chemical vapor deposited oxide, nitride or oxynitride films.

SUMMARY OF THE INVENTION

The invention provides a process for treating a dielectric layer on a substrate which comprises
  (a) heating a surface of the dielectric layer and exposing the dielectric layer to electron beam irradiation under vacuum conditions, for a sufficient time, temperature, electron beam energy and electron beam dose to remove substantially all moisture and/or contaminants from the surface of the dielectric layer; and
  (b) chemical vapor depositing a chemical vapor deposit material onto the surface of the dielectric layer while maintaining said vacuum conditions.

The invention also provides a process for producing a support for a microelectronic device which comprises:
  (a) applying a dielectric layer onto a substrate;
  (b) curing the dielectric layer;
  (c) heating a surface of the dielectric layer and exposing the dielectric layer to electron beam irradiation under vacuum conditions, for a sufficient time, temperature, electron beam energy and electron beam dose to remove substantially all moisture and/or contaminants from the surface of the dielectric layer; and
  (d) chemical vapor depositing chemical vapor deposit material onto the surface of the dielectric layer while maintaining said vacuum conditions.

The invention further provides a A support for a microelectronic device which comprises:
  (a) a substrate;
  (b) a cured dielectric layer on the substrate, the surface of which dielectric layer has been exposed to sufficient electron beam radiation to render the dielectric layer surface substantially devoid of moisture and contaminants; and
  (c) a chemical vapor deposited chemical vapor deposit material on the surface of the dielectric layer.

The invention also provides a microelectronic device which comprises:
  (a) a substrate;
  (b) a cured dielectric layer on the substrate, the surface of which dielectric layer has been exposed to sufficient electron beam radiation to render the dielectric layer surface substantially devoid of moisture and contaminants;
  (c) a chemical vapor deposited chemical vapor deposit material layer on the surface of the dielectric layer; and
  (d) a pattern of conductive lines on the chemical vapor deposit material layer.

DETAILED DESCRIPTION OF THE INVENTION

The first step in conducting the process of the present invention is to form a dielectric composition layer on a substrate. Typical substrates are those suitable to be processed into an integrated circuit or other microelectronic device. Suitable substrates for the present invention nonexclusively include semiconductor materials such as gallium arsenide (GaAs), germanium, lithium niobate, silicon and compositions containing silicon such as silicon germanium, crystalline silicon, polysilicon, amorphous silicon, epitaxial silicon, and silicon dioxide ($SiO_2$) and mixtures thereof.

On the surface of the substrate is an optional pattern of raised lines, such as metal, oxide, nitride or oxynitride lines which are formed by well known lithographic techniques. Suitable materials for the lines include silica, silicon nitride, titanium nitride, tantalum nitride, aluminum, aluminum alloys, copper, copper alloys, tantalum, tungsten and silicon oxynitride. These lines form the conductors or insulators of an integrated circuit. Such are typically closely separated from one another at distances of about 20 micrometers or less, preferably 1 micrometer or less, and more preferably from about 0.05 to about 1 micrometer.

The dielectric composition may comprise any of a wide variety of dielectric forming materials which are well known in the art for use in the formation of microelectronic devices. Such may be organic or inorganic. The dielectric layer may nonexclusively include silicon containing spin-on glasses, i.e. silicon containing polymer such as an alkoxysilane polymer, a silsesquioxane polymer such as a hydrogen silsesquioxane polymer, a siloxane polymer, a poly(arylene ether), a fluorinated poly(arylene ether), other polymeric dielectric materials, nanoporous silica or mixtures thereof.

One useful polymeric dielectric materials useful for the invention includes a nanoporous silica alkoxysilane polymer formed from an alkoxysilane monomer which has the formula:

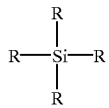

wherein at least 2 of the R groups are independently $C_1$ to $C_4$ alkoxy groups and the balance, if any, are independently selected from the group consisting of hydrogen, alkyl, phenyl, halogen, substituted phenyl. Preferably each R is methoxy, ethoxy or propoxy. Such are commercially available from AlliedSignal as Nanoglass™. The most preferred alkoxysilane monomer is tetraethoxysilane (TEOS). Also useful are hydrogensiloxanes which have the formula $[(HSiO1.5)_xO_y]_n$, hydrogensilsesquioxanes which have the formula $(HSiO_{1.5})_n$, and hydroorganosiloxanes which have the formulae $[(HSiO_{1.5})_xO_y(RSiO_{1.5})_z]_n$, $[(HSiO_{1.5})_x(RSiO_{1.5})_y]_n$ and $[(HSiO_{1.5})_xO_y(RSiO_{1.5})_z]_n$. In each of these polymer formulae, x=about 6 to about 20, y=1 to about 3, z=about 6 to about 20, n=1 to about 4,000, and each R is independently H, $C_1$ to $C_8$ alkyl or $C_6$ to $C_{12}$ aryl. The weight average molecular weight may range from about 1,000 to about 220,000. In the preferred embodiment n ranges from about 100 to about 800 yielding a molecular weight of from about 5,000 to about 45,000. More preferably, n ranges from about 250 to about 650 yielding a molecular weight of from about 14,000 to about 36,000. Useful polymers within the context of this invention non-exclusively include hydrogensiloxane, hydrogensilsesquioxane, hydrogenmethylsiloxane, hydrogenethylsiloxane, hydrogenpropylsiloxane, hydrogenbutylsiloxane, hydrogentert-butylsiloxane, hydrogenphenylsiloxane, hydrogenmethylsilsesquioxane, hydrogenethylsilsesquioxane, hydrogenpropylsilsesquioxane, hydrogenbutylsilsesquioxane, hydrogentert-butylsilsesquioxane and hydrogenphenylsilsesquioxane and mixtures thereof. Useful organic polymers include polyimides, fluorinated and nonfluorinated polymers, in particular fluorinated and nonfluorinated poly(arylethers) available under the tradename FLARE™ from AlliedSignal Inc., and copolymer mixtures thereof. The hydroorganosiloxanes, poly(arylene ethers), fluorinated poly(arylene ethers) and mixtures thereof are preferred. Suitable poly(arylene ethers) or fluorinated poly(arylene ethers) are known in the art from U.S. Pat. Nos. 5,155,175; 5,114,780 and 5,115,082. Preferred poly(arylene ethers) and fluorinated poly(arylene ethers) are disclosed in U.S. patent application Ser. No. 08/990,157 filed Dec. 12, 1997 which is incorporated herein by reference. Preferred siloxane materials suitable for use in this invention are commercially available from AlliedSignal Inc. under the tradename Accuglass™ T-11, T-12 and T-14. Also useful are methylated siloxane polymers available from AlliedSignal Inc. under the tradenames Purespin™ and Accuspin™ T 18, T23 and T24.

Preferred silicon containing dielectric resins include polymers having a formula selected from the group consisting of $[(HSiO_{1.5})_xO_y]_n$, $(HSiO_{1.5})_n$, $[(HSiO_{1.5})_xO_y(RSiO_{1.5})_z]_n$, $[(HSiO_{1.5})_x(RSiO_{1.5})_y]_n$ and $[(HSiO_{1.5})_xO_y(RSiO_{1.5})_z]_n$ wherein x=about 6 to about 20, y=1 to about 3, z=about 6 to about 20, n=1 to about 4,000, and each R is independently H, $C_1$ to $C_8$ alkyl or $C_6$ to $C_{12}$ aryl which are disclosed in U.S. patent application Ser. No. 08/955,802 filed Oct. 22, 1997 and which is incorporated herein by reference. Also preferred are certain low organic content silicon containing polymers such as those having the formula I:

$$[H\text{—}SiO_{1.5}]_n[R\text{—}SiO_{1.5}]_m,$$

$$[H_{0.4}\text{—}SiO_{1.5-1.8}]_n[R_{0.4-1.0}\text{—}SiO_{1.5-1.8}]_m,$$

$$[H_{0-1.0}\text{—}SiO_{1.5-2.0}]_n[R\text{—}SiO_{1.5}]_m,$$

$$[H\text{—}SiO_{1.5}]_x[R\text{—}SiO_{1.5}]_y[SiO_2]_z,$$

wherein the sum of n and m, or the sum or x, y and z is from about 8 to about 5000, and m and y are selected such that carbon containing substituents are present in an amount of less than about 40 Mole percent. Polymers having the structure I are of low organic content where the carbon containing substituents are present in an amount of less than about 40 mole percent. These polymers are described more fully in U.S. patent application Ser. No. 09/044,831, filed Mar. 20, 1998, which is incorporated herein by reference. Also preferred are certain low organic content silicon containing polymers such as those having the formula II:

$$[HSiO_{1.5}]_n[RSiO_{1.5}]_m,$$

$$[H_{0.4-1.0}SiO_{1.5-1.8}]_n[R_{0.4-1.0}SiO_{1.5-1.8}]_m,$$

$$[H_{0-1.0}SiO_{1.5-2.0}]_n[RSiO_{1.5}]_m,$$

wherein the sum of n and m is from about 8 to about 5000 and m is selected such that the carbon containing substituent is present in an amount of from about 40 Mole percent or greater; and $$[HSiO_{1.5}]_x[RSiO_{1.5}]_y[SiO_2]_z;$$

wherein the sum of x, y and z is from about 8 to about 5000 and y is selected such that the carbon containing substituent is present in an amount of about 40 Mole % or greater; and wherein R is selected from substituted and unsubstituted straight chain and branched alkyl groups, cycloalkyl groups, substituted and unsubstituted aryl groups, and mixtures thereof. The specific mole percent of carbon containing substituents is a function of the ratio of the amounts of starting materials. Polymers having the structure II which are of high organic content where the carbon containing substituents are present in an amount of about 40 mole percent or more. These polymers are described more fully in U.S. patent application Ser. No. 09/044,798, filed Mar. 20, 1998, which is incorporated herein by reference.

The dielectric polymer may be present in the dielectric composition in a pure or neat state (not mixed with any solvents) or it may be present in a solution where it is mixed with solvents. Preferably the dielectric polymer is dispersed in a suitable compatible solvent and applied onto a substrate. Suitable solvent compositions include those which have a boiling point of about 120° C. or less, preferably about 100° C. or less. Suitable solvents nonexclusively include methanol, ethanol, n-propanol, isopropanol, n-butanol; aprotic solvents such as cyclic ketones including cyclopentanone, cyclohexanone and cyclooctanone; cyclic amides such as N-alkylpyrrolidinone wherein the alkyl group has from 1 to about 4 carbon atoms, and N-cyclohexyl-pyrrolidinone, and mixtures thereof. Other relatively high volatility solvent compositions which are compatible with the other ingredients can be readily determined by those skilled in the art. When solvents are present, the polymer is preferably present in an amount of from about 1% to about 50% by weight of the polymer, more preferably from about 3% to about 20%. The solvent component is preferably present in an amount of from about 50% to about 99% by weight of the dielectric composition, more preferably from about 80% to about 97%.

Once formed, the dielectric composition is deposited onto a substrate to thereby form a dielectric polymer layer on the substrate. Deposition may be conducted via conventional spin-coating, dip coating, roller coating, spraying, chemical vapor deposition methods, or meniscus coating methods which are well-known in the art. Spin coating is most preferred. The thickness of the polymer layer on the substrate may vary depending on the deposition procedure and parameter setup, but typically the thickness may range from about 500 Å to about 50,000 Å, and preferably from about 2000 Å to about 12000 Å. The amount of dielectric composition applied to the substrate may vary from about 1 ml to about 10 ml, and preferably from about 2 ml to about 8 ml. In the preferred embodiment, the liquid dielectric composition is spun onto the upper surface the substrate according to known spin techniques. Preferably, the polymer layer is applied by centrally applying the liquid dielectric composition to the substrate and then spinning the substrate on a rotating wheel at speeds ranging from about 500 to about 6000 rpm, preferably from about 1500 to about 4000 rpm, for about 5 to about 60 seconds, preferably from about 10 to about 30 seconds, in order to spread the solution evenly across the substrate surface. The polymer layer preferably has a density of from about 1 $g/cm^3$ to about 3 $g/cm^3$.

In an optional but preferred step, the treated wafer substrate is then heated for a time and at a temperature sufficient to evaporate the solvents from the film or to cure the film. This may be conducted, for example by a hot plate heat treatment at a temperature of from about 170° C. to about 320° C. for about 10 seconds to about 5 minutes, preferably for from about 30 seconds to about 60 minutes. This is preferably done on a hot plate but may also be done in an oven. The heat treatment of the film crosslinks, solidifies and partially planarizes the layer. After the coating is heated, the thickness of the resulting film ranges from about 500 Å to about 50,000 Å, preferably from about 500 Å to about 20,000 Å, and most preferably from about 1,000 Å to about 12,000 Å. The polymer layer may also optionally be cured by exposure to actinic light, such as UV light, to increase its molecular weight. The amount of exposure may range from about 100 $mJ/cm^2$ to about 300 $mJ/cm^2$.

The film may also be cured by exposing the surface of the substrate to a flux of electrons. Whether the film is cured by electron beam exposure or is cured by other means such as heating or exposure to UV light, the surface of the dielectric film is exposed to sufficient electron beam exposure to remove substantially all moisture and contaminants from the surface of the dielectric layer.

Such a treatment is performed by placing the substrate inside the chamber of a large area electron beam exposure system, such as that described in U.S. Pat. No. 5,003,178 to Livesay, the disclosure of which is incorporated herein by reference. This apparatus exposes the entire substrate to a flood electron beam flux all at once. The period of electron beam exposure will be dependent on the strength of the beam dosage, the electron beam energy applied to the substrate and the beam current density. One of ordinary skill in the art can readily optimize the conditions of exposure. Preferably the electron beam exposure is done at a vacuum in the range of from about $10^{-5}$ to about $10^2$ torr, and with a substrate temperature in the range of from about 25° C. to about 1050° C. When the electron beam is used both for dielectric curing and surface treatment, energy will fall into the range of from about 0.5 to about 30 KeV, preferably from about 1 to about 15 KeV and more preferably from about 1 to about 8 KeV. When the electron beam is used both for dielectric curing and surface treatment, the electron beam dose will fall into the range of from about 1 to about 100,000 $\mu C/cm^2$, preferably from about 100 to about 10,000 $\mu C/cm^2$, and more preferably from about 1 to about 8,000 $\mu C/cm^2$. The dose and energy selected will be proportional to the thickness of the films to be processed. When the electron beam is used as a dielectric surface treatment, energy and doses will fall into the ranges of about 0.5 to about 3 KeV and about 100 to about 5,000 $\mu C/cm^2$, respectively. The appropriate doses and energies may easily be determined by those skilled in the art for the case at hand. With the surface treatment, the electron beam is concentrated at a distance within about 1000 Å from the surface of the dielectric layer. The electron beam irradiation conditions are sufficient to remove substantially all moisture, hydrocarbons, organic solvents and particles on the surface of the dielectric layer and at a depth of up to about 1000 Å from the surface. Generally the exposure will range from about 0.5 minute to about 120 minutes, and preferably from about 1 minute to about 60 minutes. The dielectric coated substrate may be exposed to electron beams in any chamber having a means for providing electron beam radiation to substrates placed therein. The dielectric is preferably subjected to an electron beam radiation from a uniform large-area electron beam source under conditions sufficient to anneal the dielectric film. Preferably the exposure is conducted with an electron beam which covers an area of from about 4 square inches to about 256 square inches. The gaseous ambient in the electron beam system chamber may be nitrogen, hydrogen, argon, oxygen, or any combinations of these gases.

The treated dielectric surface is now conditioned for the reception of a chemical vapor deposited material such as a metal, oxide, nitride or oxynitride layer to the surface of the dielectric layer. Chemical vapor deposition processes are well known to those skilled in the art and chemical vapor deposition reactors are widely commercially available. One suitable reactor is model SK-23-6-93 commercially available from Vactronic Equipment Labs of Bohemia, N.Y. The surface of the dielectric is applied with a material such as silicon nitride, titanium nitride, tantalum nitride, tantalum oxynitride, tungsten oxynitride, silicon oxynitride and blends thereof. The oxide nitride or oxynitride layer is typically deposited over the dielectric on the substrate to a thickness of from about 200 to about 6,000 Å.

Preferably the overall process of electron beam surface treatment and chemical vapor deposition is within a cluster tool having an electron beam irradiation chamber, a chemical vapor deposition chamber, and means for transferring the substrate from the electron beam irradiation chamber to the chemical vapor deposition chamber. The electron beam irradiation chamber, the chemical vapor deposition and the transferring from the electron beam irradiation chamber to the chemical vapor deposition chamber are conducted while continuously maintaining vacuum conditions. Such a cluster tool is described in U.S. patent application Ser. No. 09/272, 869, filed Mar. 19, 1999 which is incorporated herein by reference. Wafers are continuously maintained in an isolated environment at a constant vacuum pressure level, and transferred into and out of an external atmospheric pressure environment through one or more access ports or load-locks. In a typical system, a cassette or carrier with a series of wafers is placed at an interface port of the cluster tool and latches release the port door. A manipulator robot picks up the cassette or individual wafers and directs them to desired processing stations within the equipment. After processing, the reverse operation takes place. Such a wafer processing technique essentially eliminates contaminates since treatment takes place after the wafers are sealed in the internal vacuum environment, and they are not removed prior to completion of processing. The configuration achieves a significant improvement over the conventional handling of open cassettes inside a clean room. In addition, since the vacuum is not broken from step to step, the use of cluster tools increases process productivity. The use of a cluster tool significantly aids semiconductor processing throughput. As a result, electron beam surface treatment and chemical vapor deposition can be done directly within a cluster tool without breaking vacuum or removal from the cluster tool.

The following nonlimiting examples serve to illustrate the invention.

EXAMPLE 1

A thin film of poly(arylene ether) polymer having a molecular weight of 35,000 is formed on a 4" silicon wafer using a conventional spin-coating technique. After spin-coating, the film is subjected to a hot-plate bake at a temperature of 150° C. for 2 min. The film thickness after the spinning and baking processes is in the range of 8000 to 10000 Å. Thermal curing is carried out at 425° C. for one hour in a horizontal furnace with $N_2$ flow at atmospheric pressure. Electron beam exposure is conducted in an ElectronCure™ 30 chamber incorporating a large area electron source and quartz lamps for heating the wafer. The cold-cathode source produces a large area electron beam (over 200 mm in diameter) having a substantially uniform emission over its entire surface. Electron emission is controlled by the low bias voltage applied to the anode grid. The electron beam penetration depth is about 1000 Å. Electron beam exposure was conducted at a temperature of 200° C. and in an argon atmosphere (10–30 milliTorr). The surface of the polymer is then coated with a layer of silicon nitride by chemical vapor deposition. The silicon nitride layer shows good adhesion to the surface of the dielectric polymer layer.

EXAMPLE 2

A thin film of a siloxane polymer commercially available from AlliedSignal Inc. under the tradename Accuglass® T-11 is formed on a 4" silicon wafer using a conventional spin-coating technique. After spin-coating, the film is subjected to a hot-plate bake at a temperature of 150° C. for 2 min. The film thickness after the spinning and baking processes is about 4000 Å. Thermal curing is carried out at 425° C. for one hour in a horizontal furnace with $N_2$ flow at atmospheric pressure. The polymer is subjected to an electron beam exposure in an ElectronCure™ 30 chamber incorporating a large area electron source and quartz lamps for heating the wafer. The cold-cathode gas source produces a large area electron beam (over 200 mm in diameter) having a substantially uniform emission over its entire surface. Electron emission is controlled by the low bias voltage applied to the anode grid. The electron beam penetration depth is about 1000 Å. Electron beam exposure was conducted at a temperature of 200° C. and in an argon atmosphere (10–30 milliTorr). The surface of the polymer is then coated with a layer of silicon oxide by chemical vapor deposition. The silicon nitride layer shows good adhesion to the surface of the dielectric polymer layer.

EXAMPLE 3

A thin film of poly(arylene ether) dielectric polymer having a molecular weight of 35,000 is formed on a 4" silicon wafer using a conventional spin-coating technique. After spin-coating, the film is subjected to a hot-plate bake at a temperature of 150° C. for 2 min. The film thickness after the spinning and baking processes is in the range of 8000 to 10000 Å. Thermal curing is carried out at 425° C. for one hour in a horizontal furnace with $N_2$ flow at atmospheric pressure.

The dielectric coated wafer is then inserted into a cluster tool having an interconnected electron beam exposure module and a chemical vapor deposition module. A vacuum is applied through the entire tool including the electron beam exposure module, the chemical vapor deposition module and a transport zone between the modules. The wafer is transported to the electron beam exposure module where it is exposed to electron beam radiation using a large area electron source while being heated. The cold-cathode source produces a large area electron beam (over 200 mm in diameter) having a substantially uniform emission over its entire surface. Electron emission is controlled by the low bias voltage applied to the anode grid. The electron beam penetration depth is about 1000 Å. Electron beam exposure was conducted at a temperature of 200° C. and in an argon atmosphere (10–30 milliTorr). Without breaking the vacuum, the treated wafer is transported to the chemical vapor deposition module where the surface of the dielectric polymer is then applied with a layer of silicon nitride by chemical vapor deposition. After removal from the tool, the silicon nitride layer shows good adhesion to the surface of the dielectric polymer layer.

While the present invention has been particularly shown and described with reference to preferred embodiments, it will be readily appreciated by those of ordinary skill in the art that various changes and modifications may be made without departing from the spirit and scope of the invention. In particular, while the foregoing examples have employed certain dielectric materials, these are only exemplary and many others could be used as well such as silicon containing polymers including alkoxysilane polymers, silsesquioxane polymers, siloxane polymers; poly(arylene ethers), fluorinated poly(arylene ethers), other polymeric dielectric materials, nanoporous silicas or mixtures thereof. It is intended that the claims be to interpreted to cover the disclosed embodiments, those alternatives which have been discussed above and all equivalents thereto.

What is claimed is:

1. A process for treating a dielectric layer on a substrate which comprises
    (a) heating a surface of the dielectric layer and exposing the dielectric layer to electron beam irradiation under vacuum conditions, for a sufficient time, temperature, electron beam energy and electron beam dose to remove substantially all moisture and/or contaminants from the surface of the dielectric layer, and
    (b) chemical vapor depositing a chemical vapor deposit material onto the surface of the dielectric layer while maintaining said vacuum conditions.

2. The process of claim 1 wherein the chemical vapor deposit material comprises a metal, an oxide, a nitride or an oxynitride.

3. The process of claim 1 wherein the dielectric layer is organic.

4. The process of claim 1 wherein the dielectric layer is inorganic.

5. The process of claim 1 wherein the dielectric layer comprises a silicon containing polymer, an alkoxysilane polymer, a silsesquioxane polymer, a siloxane polymer, a poly(arylene ether), a fluorinated poly(arylene ether), a nanoporous silica or combinations thereof.

6. The process of claim 1 wherein the surface of the dielectric is applied with a material selected from the group consisting of silicon dioxide, silicon nitride, titanium nitride, tantalum nitride, tantalum oxynitride, tungsten oxynitride and silicon oxynitride.

7. The process of claim 1 wherein the substrate comprises a semiconductor material.

8. The process of claim 1 wherein the substrate comprises a material selected from the group consisting of gallium arsenide, germanium, silicon, silicon germanium, lithium niobate, crystalline silicon, polysilicon, amorphous silicon, epitaxial silicon, silicon dioxide and mixtures thereof.

9. The process of claim 1 wherein the heating is conducted at a temperature of from about 80° C. to about 500° C. for from about 1 to about 6 minutes.

10. The process of claim 1 wherein the electron beam exposing step is conducted at an energy level ranging from about 0.5 to about 30 KeV.

11. The process of claim 1 wherein the electron beam exposing step is conducted at an energy level ranging from about 0.5 to about 3 KeV.

12. The process of claim 1 wherein the electron beam exposing step is conducted at an electron dose ranging from about 50 to about 50,000 $\mu C/cm^2$.

13. The process of claim 1 wherein the electron beam exposing step is conducted by overall exposing the dielectric layer with a wide, large beam of electron beam radiation from a large-area electron beam source.

14. The process of claim 1 wherein the electron beam exposing step is conducted by overall exposing the dielectric layer with a wide, large beam of electron beam radiation from a uniform large-area electron beam source which covers an area of from about 4 square inches to about 256 square inches.

15. The process of claim 1 wherein the electron beam is concentrated at a distance within about 1000 Å from the surface of the dielectric layer.

16. The process of claim 1 wherein the electron beam irradiation is conducted at conditions sufficient to remove substantially all moisture, hydrocarbons, organic solvents and particles on the surface of the dielectric layer and at a depth of up to about 1000 Å from the surface.

17. The process of claim 1 which is conducted within a tool having an electron beam irradiation chamber, a chemical vapor deposition chamber, and means for transferring the substrate from the electron beam irradiation chamber to the chemical vapor deposition chamber and wherein the electron beam irradiation chamber, the chemical vapor deposition and the transferring from the electron beam irradiation chamber to the chemical vapor deposition chamber are conducted while continuously maintaining vacuum conditions.

18. A process for producing a support for a microelectronic device which comprises:

(a) applying a dielectric layer onto a substrate;

(b) curing the dielectric layer;

(c) heating a surface of the dielectric layer and exposing the dielectric layer to electron beam irradiation under vacuum conditions, for a sufficient time, temperature, electron beam energy and electron beam dose to remove substantially all moisture and/or contaminants from the surface of the dielectric layer; and (d) chemical vapor depositing a chemical vapor deposit material onto the surface of the dielectric layer while maintaining said vacuum conditions.

19. The process of claim 18 wherein step (b) is conducted such that the dielectric layer is cured with one or more treatments selected from the group consisting is ultraviolet radiation, electron beam radiation and heating under conditions sufficient to cure the dielectric layer.

20. The process of claim 18 wherein the dielectric layer is applied onto the substrate by coating a liquid dielectric precursor composition onto the substrate.

21. The process of claim 18 wherein the dielectric is cured by heating the dielectric layer and/or exposing the dielectric layer to electron beam irradiation, under conditions sufficient to cure the dielectric layer.

22. The process of claim 18 wherein the electron beam irradiation is conducted at conditions sufficient to remove substantially all moisture, hydrocarbons, organic solvents and particles on the surface of the dielectric layer and at a depth of up to about 1000 Å from the surface.

23. The process of claim 18 which is conducted within a tool having an electron beam irradiation chamber, a chemical vapor deposition chamber, and means for transferring the substrate from the electron beam irradiation chamber to the chemical vapor deposition chamber and wherein the electron beam irradiation chamber, the chemical vapor deposition and the transferring from the an electron beam irradiation chamber to the chemical vapor deposition chamber are conducted while continuously maintaining vacuum conditions.

* * * * *